US012591366B2

(12) United States Patent
Li et al.

(10) Patent No.: US 12,591,366 B2
(45) Date of Patent: Mar. 31, 2026

(54) CONCURRENTLY WRITING LESS-DENSELY-PROGRAMMED AND MORE-DENSELY-PROGRAMMED MEMORY WITHOUT ADDITIONAL HARDWARE

(71) Applicant: Micron Technology, Inc., Boise, ID (US)

(72) Inventors: Haibo Li, Cupertino, CA (US); Xiangyu Tang, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 185 days.

(21) Appl. No.: 18/408,836

(22) Filed: Jan. 10, 2024

(65) Prior Publication Data
US 2024/0256136 A1 Aug. 1, 2024

Related U.S. Application Data

(60) Provisional application No. 63/441,362, filed on Jan. 26, 2023.

(51) Int. Cl.
*G06F 3/06* (2006.01)
*G11C 5/06* (2006.01)

(52) U.S. Cl.
CPC .......... *G06F 3/0611* (2013.01); *G06F 3/0659* (2013.01); *G06F 3/0679* (2013.01); *G11C 5/063* (2013.01)

(58) Field of Classification Search
CPC .... G06F 3/0611; G06F 3/0659; G06F 3/0679; G11C 5/063
See application file for complete search history.

(56) References Cited

U.S. PATENT DOCUMENTS

| | | | |
|---|---|---|---|
| 2009/0100244 A1* | 4/2009 | Chang ................. | G06F 12/0246 710/52 |
| 2022/0044746 A1* | 2/2022 | Hsu ........................ | G11C 16/26 |

* cited by examiner

*Primary Examiner* — Kalpit Parikh
(74) *Attorney, Agent, or Firm* — Lowenstein Sandler LLP

(57) ABSTRACT

A memory device of a first array of memory cells configured as quad-level cell (QLC) memory or penta-level cell (PLC) memory and including one or more first planes. A second array of memory cells configured as second memory that is less-densely programmed than the first array, the second array including one or more second planes. Control logic receives a first command to program a first set of memory cells of the first array with a first logical state and a second command to program a second set of memory cells of the second array with a second logical state corresponding in threshold voltage range to the first logical state. The first and second sets of memory cells are associated with a shared wordline. The control logic causes the first and second sets of memory cells to be concurrently programmed with a threshold voltage distribution corresponding to the first logical state.

20 Claims, 14 Drawing Sheets

1000

Receive a first command to program a first set of memory cells of a first array of memory cells with a first logical state, wherein the first array is configured with a first density and includes one or more first planes.
1010

Receive a second command to program a second set of memory cells of a second array of memory cells with a second logical state corresponding in threshold voltage range to the first logical state, the second array configured with a second density that is less than the first density.
1020

Cause the first set of memory cells and the second set of memory cells to be concurrently programmed with a threshold voltage distribution corresponding to the first logical state.
1030

Figure 10:
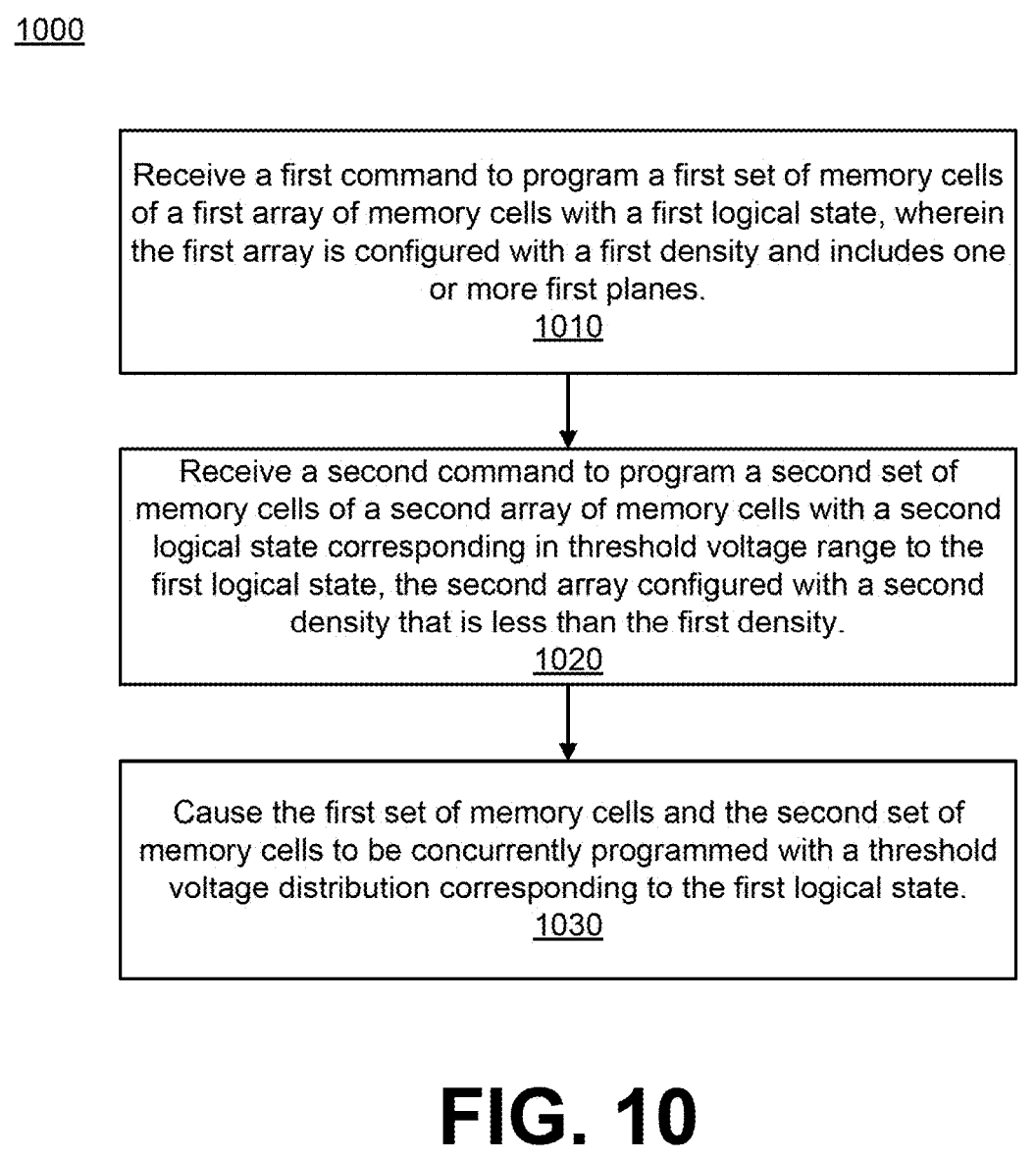

1000

Receive a first command to program a first set of memory cells of a first array of memory cells with a first logical state, wherein the first array is configured with a first density and includes one or more first planes.
1010

Receive a second command to program a second set of memory cells of a second array of memory cells with a second logical state corresponding in threshold voltage range to the first logical state, the second array configured with a second density that is less than the first density.
1020

Cause the first set of memory cells and the second set of memory cells to be concurrently programmed with a threshold voltage distribution corresponding to the first logical state.
1030

CONCURRENTLY WRITING LESS-DENSELY-PROGRAMMED AND MORE-DENSELY-PROGRAMMED MEMORY WITHOUT ADDITIONAL HARDWARE

REFERENCE TO RELATED APPLICATION

This application claims the benefit of U.S. Provisional Patent Application No. 63/441,362, filed Jan. 26, 2023, the entirety of which is incorporated herein by reference.

TECHNICAL FIELD

Embodiments of the disclosure are generally related to memory sub-systems, and more specifically, relate to a concurrently writing less-densely-programmed and more-densely-programmed memory without additional hardware.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

2

Figure 9A:
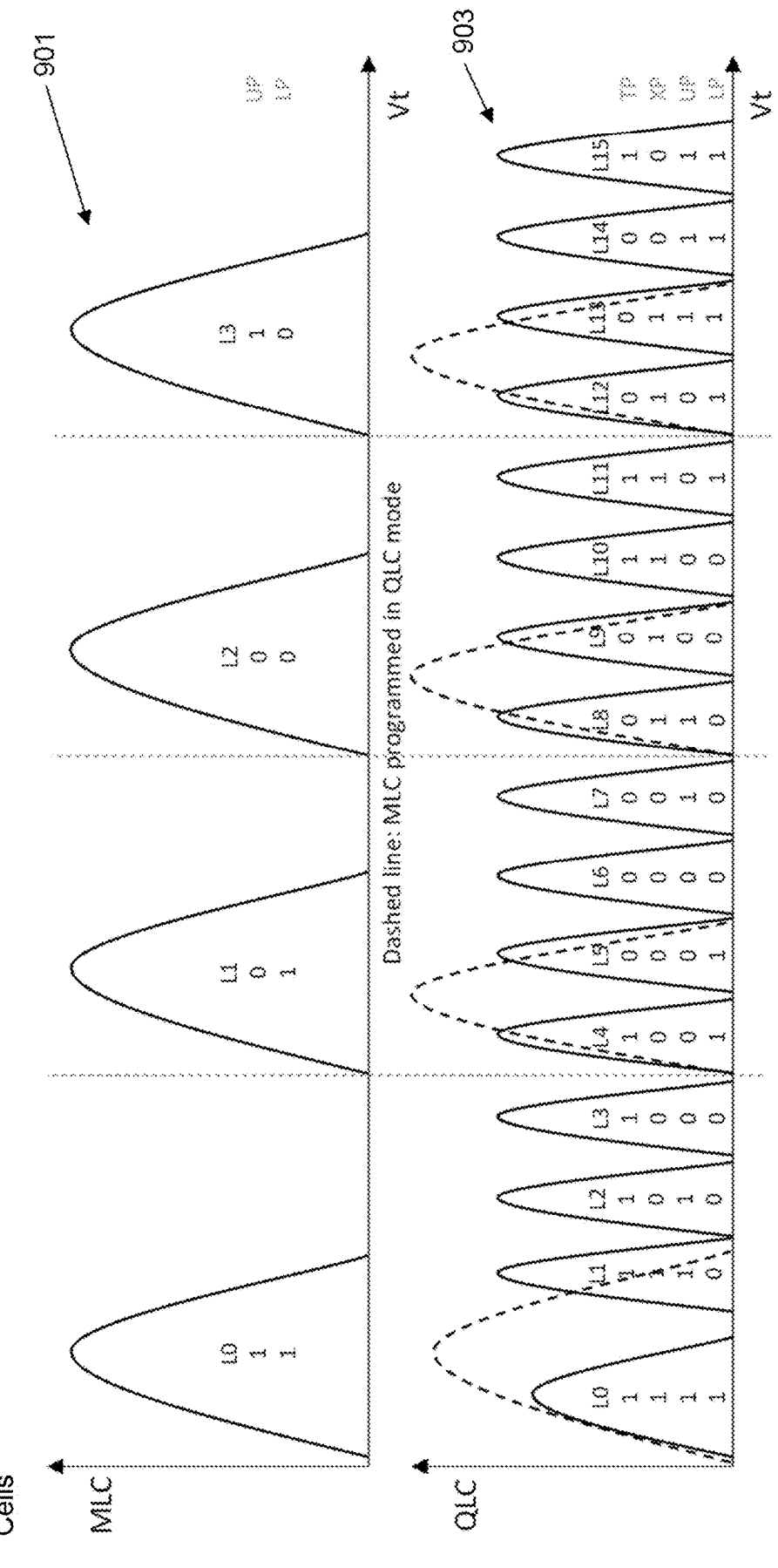

FIG. 9A is a set of graphs illustrating logical states in multi-level cell (MLC) memory that correspond in threshold voltage range to logical states in the QLC memory according to various embodiments.

Figure 9B:
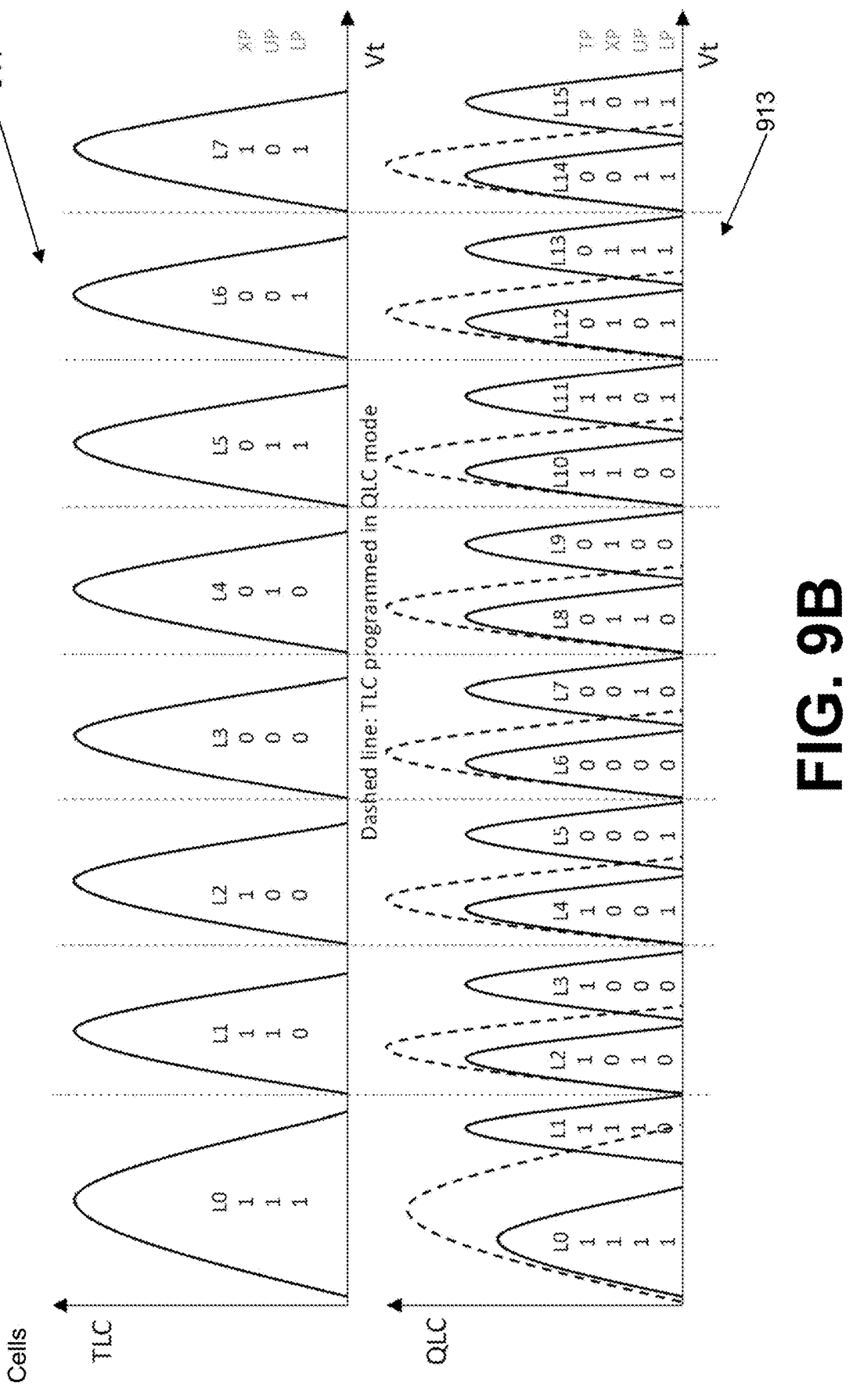

FIG. 9B is a set of graphs illustrating logical states in tri-level cell (TLC) memory that correspond in threshold voltage range to logical states in the QLC memory according to various embodiments.

FIG. 10 is a flow diagram of an example method of concurrently writing less-densely-programmed and more-densely-programmed memory at memory cells associated with a shared wordline according to various embodiments.

Figure 11:
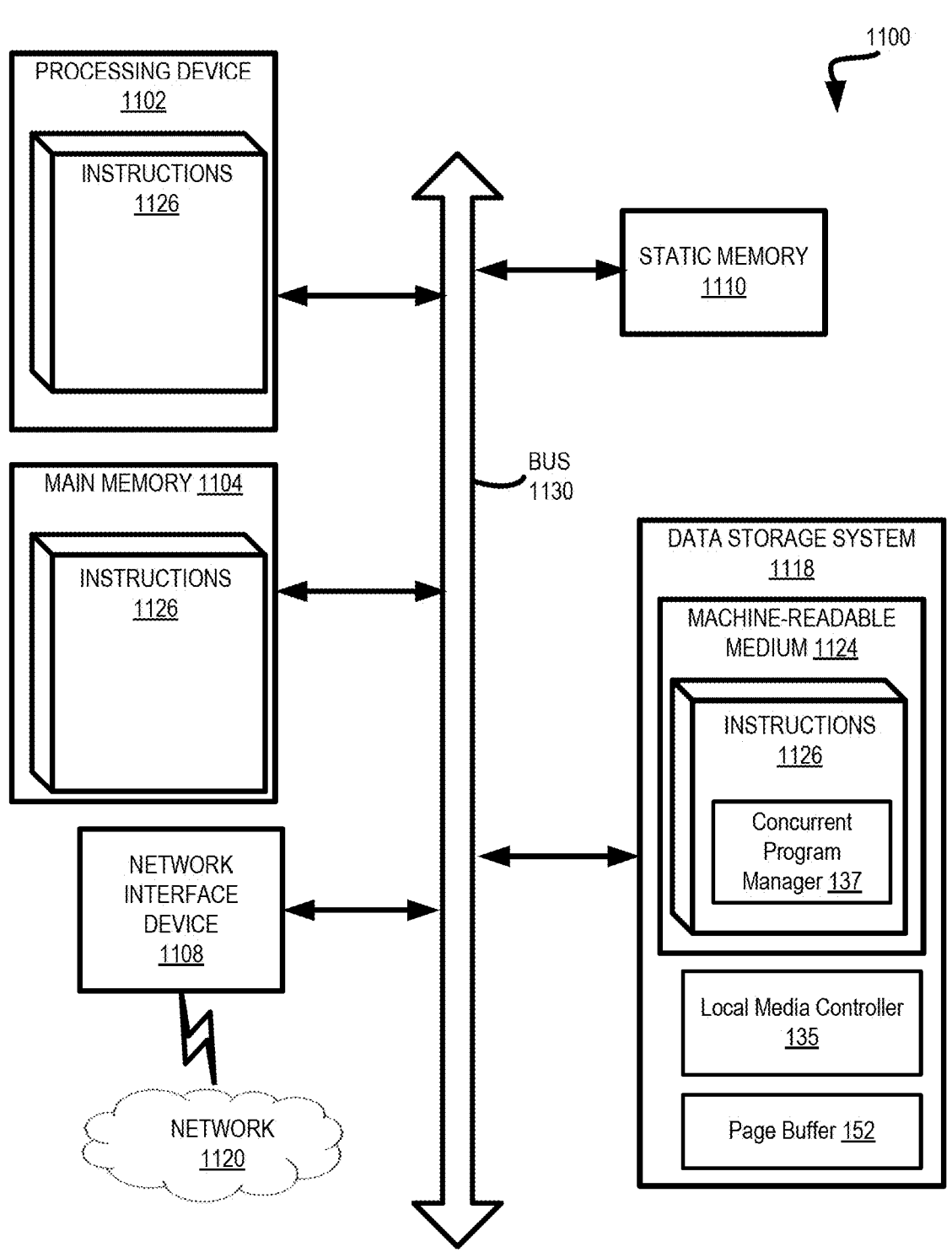

FIG. 11 is a block diagram of an example computer system in which embodiments of the present disclosure can operate.

DETAILED DESCRIPTION

Embodiments of the present disclosure are directed to concurrently writing less-densely-programmed and more-densely-programmed memory without additional hardware. One or more memory devices can be a part of a memory sub-system, which can be a storage device, a memory module, or a hybrid of a storage device and memory module. Examples of storage devices and memory modules are described below in conjunction with FIG. 1A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a NOT-and (NAND) memory device. Other examples of non-volatile memory devices are described below in conjunction with FIG. 1A. A non-volatile memory device is a package of one or more dice. Each die can include two or more planes. For some types of non-volatile memory devices (e.g., NAND devices), each plane includes of a set of physical blocks. In some implementations, each block can include multiple sub-blocks. Each plane carries a matrix of memory cells formed on a silicon wafer and joined by conductors referred to as wordlines (WLs) and bitlines (BLs), such that a wordline joins multiple memory cells forming a row of the matrix of memory cells, while a bitline joins multiple memory cells forming a column of the matrix of memory cells.

Depending on the cell type, each memory cell can store one or more bits of binary information, and has various logic states that correlate to the number of bits being stored. The logic states can be represented by binary values, such as "0" and "1," or combinations of such values, also referred to herein as logical bit values. A memory cell can be programmed (written to) by applying a certain voltage to the memory cell, which results in an electric charge being held by the memory cell, thus allowing modulation of the voltage distributions produced by the memory cell. A set of memory cells referred to as a memory page can be programmed together in a single operation, e.g., by selecting consecutive bitlines.

Precisely controlling the amount of the electric charge stored by the memory cell allows establishing multiple logical levels, thus effectively allowing a single memory cell to store multiple bits of information. A read operation can be performed by comparing the measured threshold voltages ($V_t$) exhibited by the memory cell to one or more reference voltage levels in order to distinguish between two logical levels for single-level cell (SLCs) and between multiple logical levels for multi-level cells. A memory device can include multiple portions, including, e.g., one or more portions where the sub-blocks are configured as SLC memory and one or more portions where the sub-blocks are configured as multi-level cell (MLC) memory that can store three bits of information per cell and/or (triple-level cell) TLC memory that can store three bits of information per cell. The voltage levels of the memory cells in TLC memory form a set of 8 programming (or threshold voltage ($Vt$)) distributions representing the 8 different combinations of the three bits stored in each memory cell. Depending on how the memory cells are configured, each physical memory page in one of the sub-blocks can include multiple page types. For example, a physical memory page formed from SLC memory cells has a single page type referred to as a lower logical page (LP). Multi-level cell (MLC) physical page types can include LPs and upper logical pages (UPs) and store two bits of information per cell. Further, TLC physical page types can include LPs, UPs, and extra logical pages (XPs) and store three bits of information per cell. Further, quad-level (QLC) physical page types can include LPs, UPs, XPs and top logical pages (TPs) and store four bits of information per cell. For example, a physical memory page formed from memory cells of the QLC memory type have a total of four logical pages, where each logical page stores data distinct from the data stored in the other logical pages associated with that physical memory page, herein referred to as a "page." Additionally, penta-level cell (PLC) memory can store five bits of information per cell and also include at least LPs, UPs, and XPs.

In certain memory devices, independent-plane (or iPlane) programming has been implemented that enables independent, concurrent NAND programming at different planes and blocks within the same die, enabling a higher programming rate for data being written to the die. This iPlane programming, however, requires additional costly programming hardware (such as charge pumps, line drivers, and the like) and additional voltage-controlling logic that is replicated for each plane. Without iPlane programming, these memory devices can only write the same type of data (e.g., SLC, MLC, TLC, or QLC) to the same wordline in the chosen planes and blocks because the program operation is controlled by the same power source and control logic.

In these certain memory devices, such as in QLC NAND, an SLC-based buffer (or cache) is used to boost the write performance and is employed as a protection against QLC silent programming failures, e.g., a way to store redundant data until QLC error checking is completed. In some memory systems, Zoned-Named-Space (ZNS) memory devices include zones (or groups of memory cells), each including one or more QLC blocks. When the system folds SLC-block data to QLC-block data in some planes, other planes are idle, leading to less parallelism in programming data to multi-data-type memory and a waste of performance bandwidth.

Aspects of the present disclosure address the above and other deficiencies through mapping some logical states of less-densely-programmed memory (e.g., SLC, MLC, TLC) to some logic states of more-densely-programmed memory (e.g., QLC, PLC) that correspond in threshold voltage ($Vt$) range and concurrently programming $Vt$ levels of these corresponding logical states across memory types. For example, an SLC L0 threshold voltage level may correspond closely enough to an QLC L0 threshold voltage level or an SLC L1 threshold voltage level may correspond closely enough to an QLC L6 threshold voltage level to be mapped to each other (see Table 2). Logical states that correspond in $Vt$ range may be understood to also correspond (or approximate) in program verify (or read) $Vt$ levels. Further, in some embodiments, two $Vt$ ranges can be considered to "correspond" when the two $Vt$ ranges are within a predetermined threshold value of each other and/or their corresponding program verify (or read) $Vt$ levels are within a predetermined threshold value of each other. "Corresponding" may, therefore, be less than precise matching between $Vt$ ranges or between program verify (or read) $Vt$ levels due to sufficient read window margins existing between $Vt$ ranges of programmed logical states in less-densely-programmed memory.

More generally, and for purposes of explanation, assume a first set of memory cells of the more-densely-programmed memory (e.g., QLC) is to be programmed to a first logical state (e.g., "1111" corresponding to QLC L0) and the a second set of memory cells of the less-densely-programmed memory (e.g., SLC) is to be programmed to a second logical state (e.g., "1" corresponding to SLC L0). Because these logical states correspond in threshold voltage range (see FIG. 7), the first set of memory cells and the second set of memory cells can be concurrently programmed with the QLC threshold voltage ($Vt$) distribution corresponding to the first logical state. In embodiments, this concurrent programming is made possible where the first and second sets of memory cells are associated with the same (e.g., a shared) wordline but are located in different planes of a die. A similar concurrent program may be performed if the first set of memory cells is to be programmed with the QLC L6-based logical state and the second set of memory cells is to be programmed with the SLC L1-based logical state (see Table 2).

Thus, in various embodiments, this concurrent programming can be performed without additional hardware (e.g., charge pumps, line drivers, and the like) or additional control logic, e.g., by employing the more-densely-programmed (e.g., QLC or PLC) mode of programming to program both sets of memory cells, to include the set of memory cells in the less-densely-programmed array. The QLC or PLC mode includes specific programming operations and parameters (such as threshold voltage levels and corresponding program verify voltage levels). Because more-densely-programmed memory is typically programmed in phases, both a coarse program operation and a fine program operation, a different less-densely-programmed set of memory cells can be programmed for each phase of programming of the more-densely-programmed memory. When the first logical state of the less-densely-programmed memory is later read out of the second set of memory cells, the read operation can be performed using a read level voltage associated with the second logical state (e.g., the logical state expected to have been programmed to the less-densely-programmed memory). Thus, the concurrent programming of the same logical state across the data types can be transparent to future read operations.

Therefore, advantages of the systems and methods implemented in accordance with some embodiments of the present disclosure include, but are not limited to, enabling concurrent writing (or programming) to different memory types when the memory cells being programmed are associated with a shared wordline and are in different planes of a die. This concurrent programming can be performed as often as logical states can be mapped to corresponding threshold voltage (or program verify) levels, can be employed for both coarse and fine programming operations, and can be performed without additional programming hardware (e.g., charge pumps and the like) or additional control logic that is otherwise required in iPlane-enabled memory devices. This flexibility in concurrent programming affordably improves background bandwidth, performance, and latency in writing to solid-state-based memory devices. Other advantages will be apparent to those skilled in the art of mixed memory type programming, which will be discussed hereinafter.

Figure 1A:
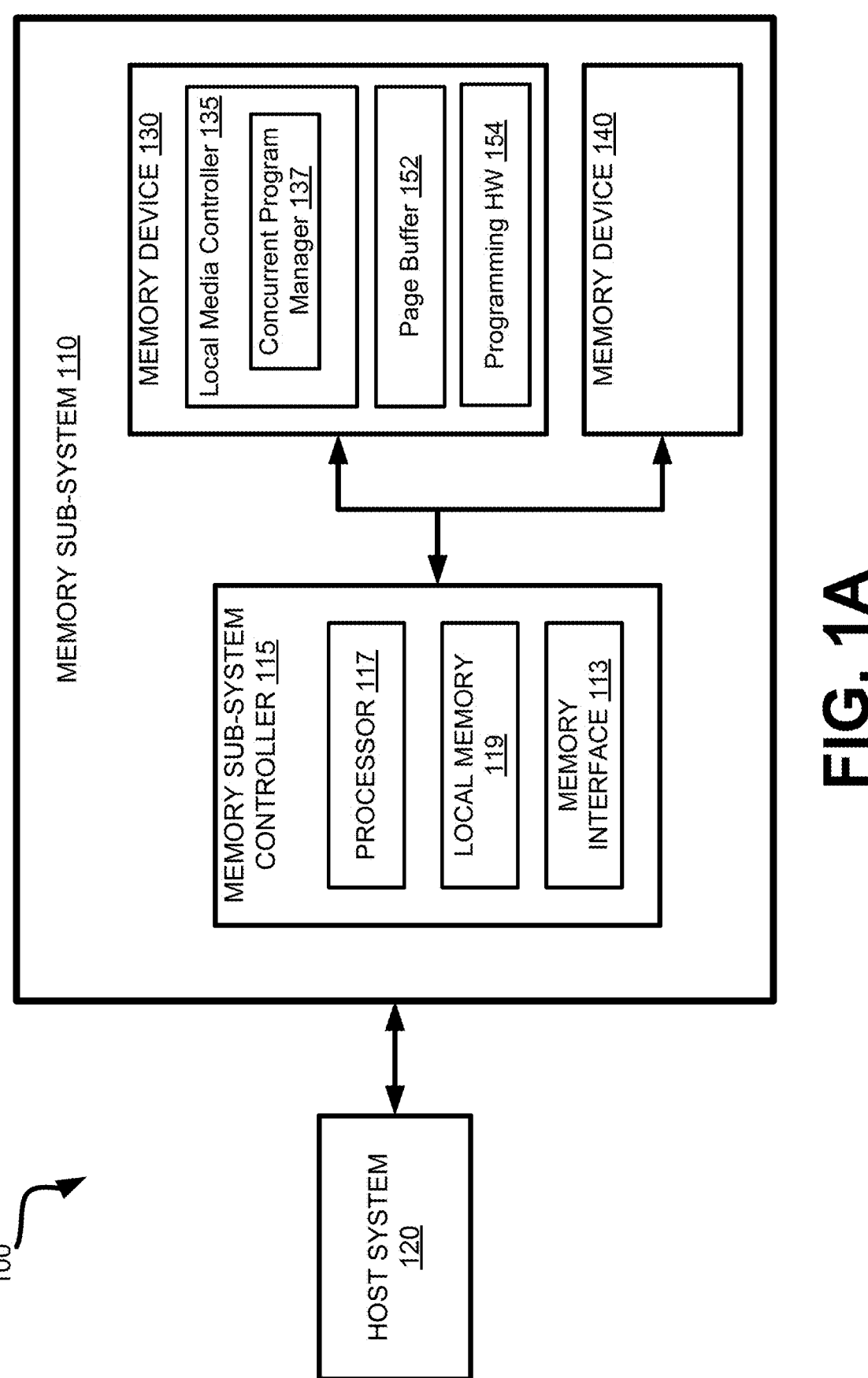
FIG. 1A illustrates an example computing system that includes a memory sub-system in accordance with some embodiments.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such media or memory devices.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. The host system 120 can provide data to be stored at the memory sub-system 110 and can request data to be retrieved from the memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a NOT-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple-level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), NOT-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage a memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. For example, the memory sub-system controller 115 can include a processor 117 (processing device) configured to execute instructions stored in local memory 119 for performing the operations described herein.

In at least one embodiment, the memory device 130 includes a concurrent program manager 137 configured to carry out memory operations, e.g., in response to receiving memory access commands from the memory interface 113. In some implementations, the local media controller 135 includes at least a portion of the concurrent program manager 137 and is configured to perform the functionality described herein. In some implementations, the concurrent program manager 137 is implemented on the memory device 130 using firmware, hardware components, or a combination of the above. In some embodiments, control logic of the concurrent program manager 137 is integrated in whole or in part within the memory sub-system controller 115 and/or the host system 120. In some embodiments, the memory device 130 includes a page buffer 152, which can provide the circuitry used to program data to the memory cells of the memory device 130 and to read the data out of the memory cells. In embodiments, the memory device 130 includes programming hardware 154 such as charge pump(s), line drivers, and the like for programming each die, plane, block of memory arrays of the memory device 130. In some embodiments, the page buffer 152 includes, or is coupled to, and activates the programming hardware 154.

In an illustrative example, the memory device 130 includes a first array of memory cells configured with a first density and includes one or more first planes. For example, the first array may be configured as tri-level cell (TLC) memory, quad-level cell (QLC) memory, or penta-level cell (PLC) memory. The memory device 130 may further include a second array of memory cells configured with a second density that is less than the first density, e.g., less-densely programmed than the first array and that includes one or more second planes. For example, the second array may be configured as SLC, MLC, or TLC memory, where if the first array is configured as TLC memory, the second array is not so configured. While some examples may be provided herein where the first density is QLC-programmed memory cells and the second density is SLC-programmed memory cells, different mixes of multiple types of memory cells are envisioned in combining SLC, MLC, TLC, QLC, and/or PLC memory in any given array.

In at least some embodiments, the memory device 130 includes a single set of charge pumps coupled with the first array and the second array. In embodiments, the control logic of the local media controller 135 is operatively coupled with the first array and the second array, e.g., via the set of charge pumps and/or other programming hardware 154. The single set of charge pumps may be configured to program memory cells of both the one or more first planes and the one or more second planes when associated with or coupled to a shared WL.

In this illustrative example, the concurrent program manager 137 receives, from a requestor, such as memory interface 113, a first command to program a first set of memory cells of a first array with a first logical state and a second command to program a second set of memory cells of the second array with a second logical state corresponding in threshold voltage range to the first logical state. In embodiments, the first set of memory cells and the second set of memory cells are associated with a shared wordline. The first and second program commands may be received around approximately the same time or the first program command is buffered when the second program command is received subsequent to the first program command, for example, or vice versa. In this illustrative embodiment, the concurrent program manager 137 further causes the first set of memory cells and the second set of memory cells to be concurrently programmed with a threshold voltage distribution corresponding to the first logical state. This concurrent programming may be performed using the existing page buffer 152 without adding additional programming hardware 154 or control logic to each die and plane that is being concurrently programmed, in contrast to what is done to enable iPlane programming.

In these embodiments, the concurrent program manager 137 can further, in response to a read command directed at the second set of memory cells, cause a read operation to be performed at the second set of memory cells using a read level voltage associated with the second logical state. In this way, a less-dense memory read operation (e.g., SLC read operation) is performed as normal although the second set of memory cells were programmed in a programming mode specific to the first density (e.g., QLC mode or PLC mode).

Figure 1B:
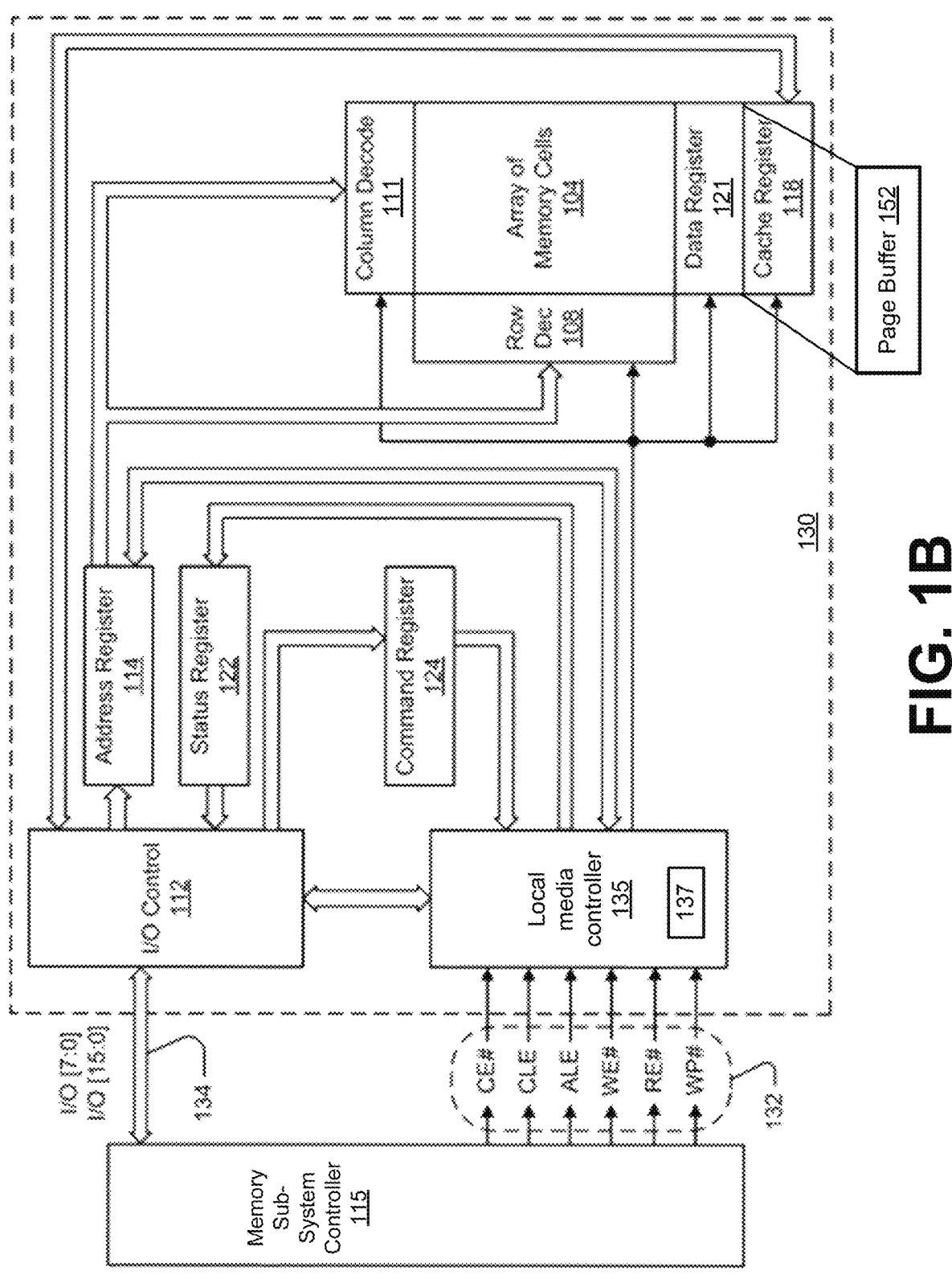
FIG. 1B is a block diagram of a memory device in communication with a memory sub-system controller of a memory sub-system according to an embodiment.

FIG. 1B is a simplified block diagram of a first apparatus, in the form of a memory device 130, in communication with a second apparatus, in the form of a memory sub-system controller 115 of a memory sub-system (e.g., the memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), can be a memory controller or other external host device.

The memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bitline). A single access line can be associated with more than one logical row of memory cells and a single data line can be associated with more than one logical column. Memory cells (not shown in FIG. 1B) of at least a portion of the array of memory cells 104 are capable of being programmed to one of at least two target data states.

Row decode circuitry 108 and column decode circuitry 111 are provided to decode address signals. Address signals are received and decoded to access the array of memory cells 104. The memory device 130 also includes input/output (I/O) control circuitry 112 to manage input of commands, addresses and data to the memory device 130 as well as output of data and status information from the memory device 130. An address register 114 is in communication with the I/O control circuitry 112 and row decode circuitry 108 and column decode circuitry 111 to latch the address signals prior to decoding. A command register 124 is in communication with the I/O control circuitry 112 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 111 to control the row decode circuitry 108 and column decode circuitry 111 in response to the addresses.

The local media controller 135 is also in communication with a cache register 118 and a data register 121. The cache register 118 latches data, either incoming or outgoing, as directed by the local media controller 135 to temporarily store data while the array of memory cells 104 is busy writing or reading, respectively, other data. During a program operation (e.g., write operation), data can be passed from the cache register 118 to the data register 121 for transfer to the array of memory cells 104; then new data can be latched in the cache register 118 from the I/O control circuitry 112. During a read operation, data can be passed from the cache register 118 to the I/O control circuitry 112 for output to the memory sub-system controller 115; then new data can be passed from the data register 121 to the cache register 118. The cache register 118 and/or the data register 121 can form (e.g., can form at least a portion of) the page buffer 152 of the memory device 130. The page buffer 152 can further include sensing devices such as a sense amplifier, to sense a data state of a memory cell of the array of memory cells 104, e.g., by sensing a state of a data line connected to that memory cell. A status register 122 can be in communication with I/O control circuitry 112 and the local memory controller 135 to latch the status information for output to the memory sub-system controller 115.

The memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) can be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands can be received over input/output (I/O) pins [7:0] of I/O bus 134 at I/O control circuitry 112 and can then be written into a command register 124. The addresses can be received over input/output (I/O) pins [7:0] of I/O bus 134 at I/O control circuitry 112 and can then be written into address register 114. The data can be received over input/output (I/O) pins [7:0] for an 8-bit device or input/output (I/O) pins [15:0] for a 16-bit device at I/O control circuitry 112 and then can be written into cache register 118. The data can be subsequently written into data register 121 for programming the array of memory cells 104.

In an embodiment, cache register 118 can be omitted, and the data can be written directly into data register 121. Data can also be output over input/output (I/O) pins [7:0] for an 8-bit device or input/output (I/O) pins [15:0] for a 16-bit device. Although reference can be made to I/O pins, they can include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) can be used in the various embodiments.

Figure 2A:
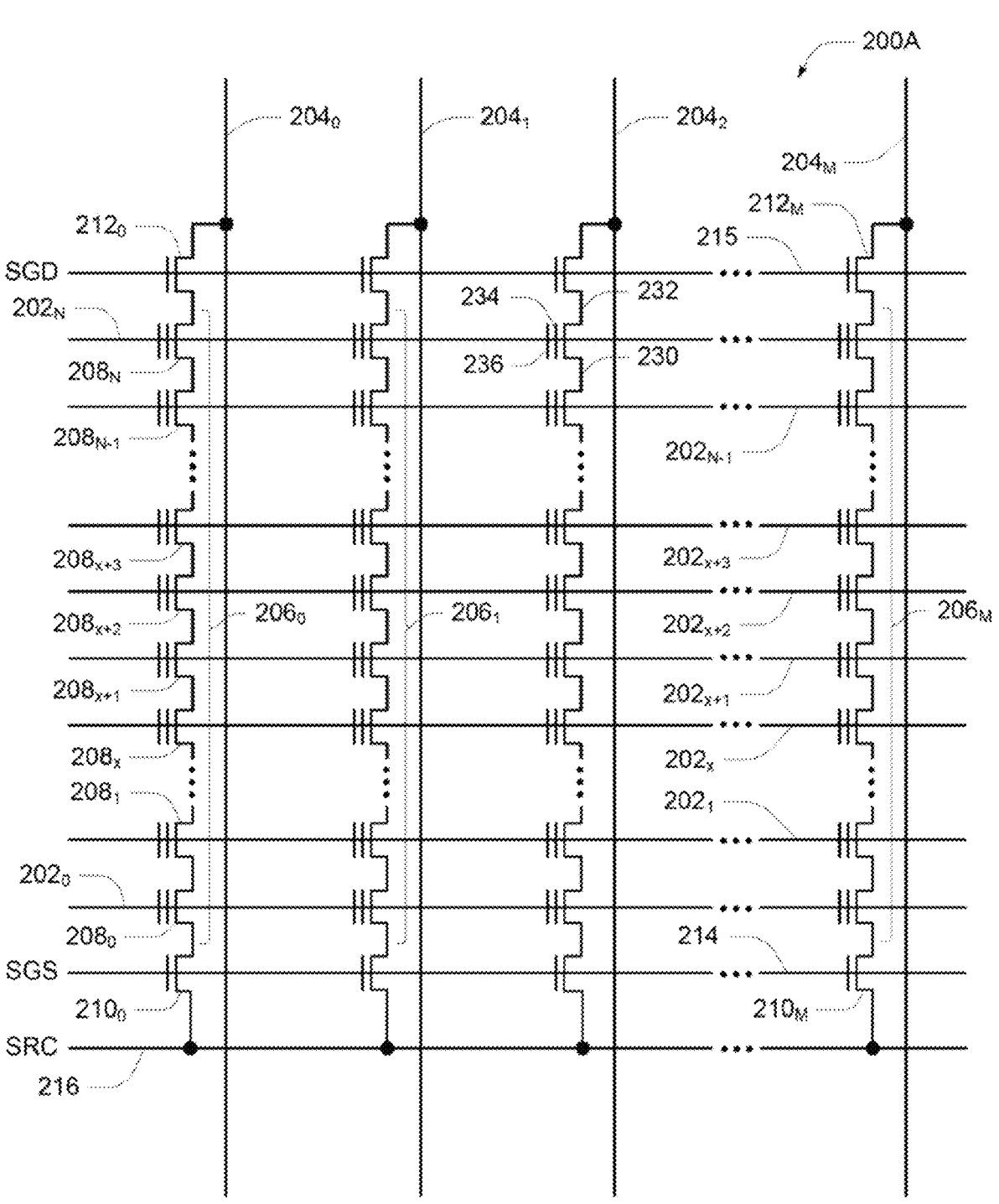
FIG. 2A-2B are schematics of portions of an array of memory cells as could be used in a memory of the type described with reference to FIG. 1B according to an embodiment.
Figure 2B:
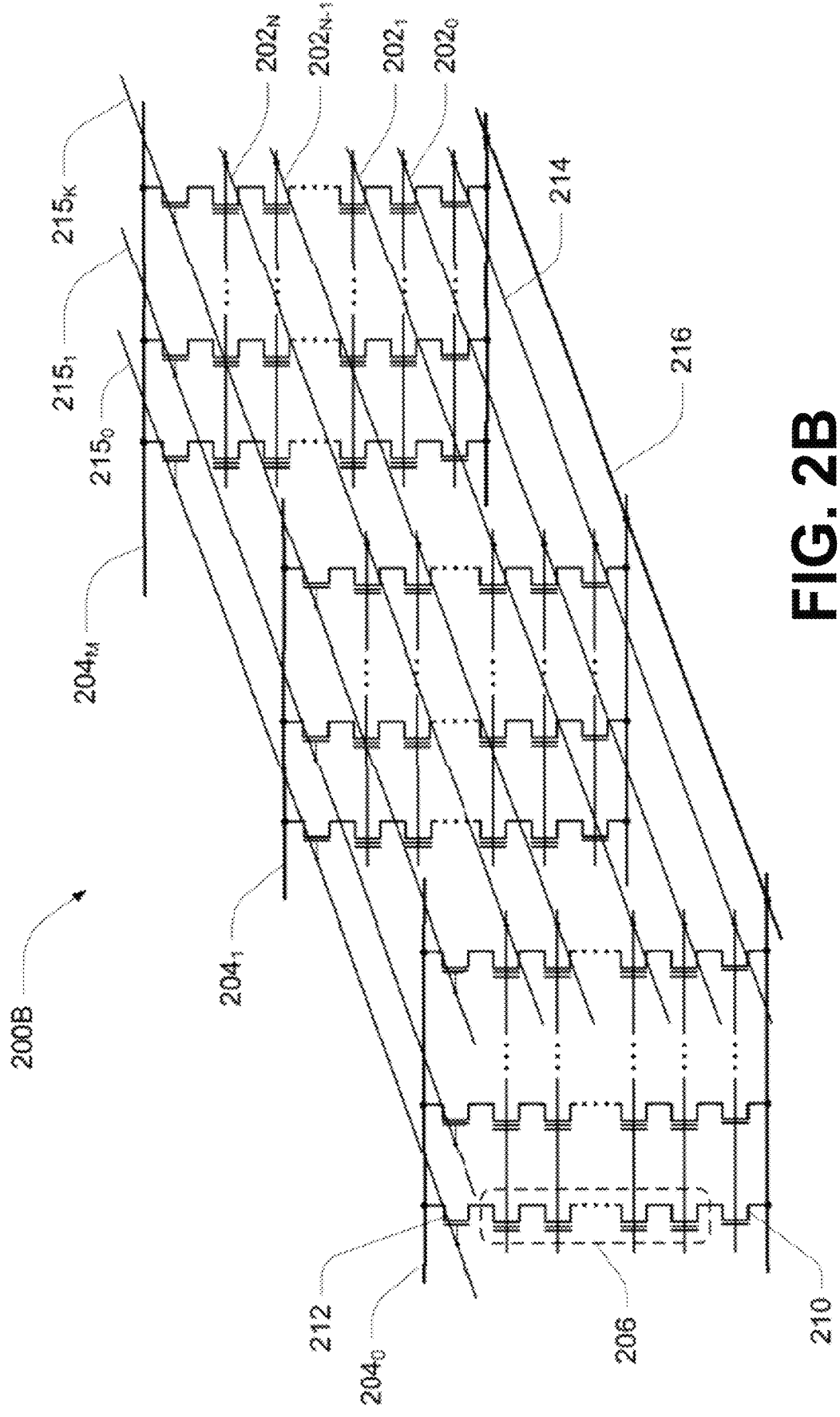

FIG. 2A-2B are schematics of portions of an array of memory cells 200A, such as a NAND memory array, as could be used in a memory of the type described with reference to FIG. 1B according to an embodiment, e.g., as a portion of the array of memory cells 104. Memory array 200A includes access lines, such as wordlines $202_0$ to $202_N$, and data lines, such as bitlines $204_0$ to $204_M$. The wordlines 202 can be connected to global access lines (e.g., global wordlines), not shown in FIG. 2A, in a many-to-one relationship. For some embodiments, memory array 200A can be formed over a semiconductor that, for example, can be conductively doped to have a conductivity type, such as a p-type conductivity, e.g., to form a p-well, or an n-type conductivity, e.g., to form an n-well.

Memory array 200A can be arranged in rows (each corresponding to a wordline 202) and columns (each corresponding to a bitline 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bitline 204 for the corresponding NAND string 206. For example, the drain of select gate $212_0$ can be connected to the bitline $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bitline 204. A control gate of each select gate 212 can be connected to select line 215.

The memory array 200A in FIG. 2A can be a quasi-two-dimensional memory array and can have a generally planar structure, e.g., where the common source 216, NAND strings 206 and bitlines 204 extend in substantially parallel planes. Alternatively, the memory array 200A in FIG. 2A can be a three-dimensional memory array, e.g., where NAND strings 206 can extend substantially perpendicular to a plane containing the common source 216 and to a plane containing the bitlines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2A. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a wordline 202.

A column of the memory cells 208 can be a NAND string 206 or a number of NAND strings 206 selectively connected to a given bitline 204. A row of the memory cells 208 can be memory cells 208 commonly connected to a given wordline 202. A row of memory cells 208 can, but need not, include all the memory cells 208 commonly connected to a given wordline 202. Rows of the memory cells 208 can often be divided into one or more groups of physical pages of memory cells 208, and physical pages of the memory cells 208 often include every other memory cell 208 commonly connected to a given wordline 202. For example, the memory cells 208 commonly connected to wordline $202_N$ and selectively connected to even bitlines 204 (e.g., bitlines $204_0$, $204_2$, $204_4$, etc.) can be one physical page of the memory cells 208 (e.g., even memory cells) while memory cells 208 commonly connected to wordline $202_N$ and selectively connected to odd bitlines 204 (e.g., bitlines $204_1$, $204_3$, $204_5$, etc.) can be another physical page of the memory cells 208 (e.g., odd memory cells).

Although bitlines $204_3$-$204_5$ are not explicitly depicted in FIG. 2A, it is apparent from the figure that the bitlines 204 of the array of memory cells 200A can be numbered consecutively from bitline $204_0$ to bitline $204_M$. Other groupings of the memory cells 208 commonly connected to a given wordline 202 can also define a physical page of memory cells 208. For certain memory devices, all memory cells commonly connected to a given wordline can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to wordlines $202_0$-$202_N$ (e.g., all NAND strings 206 sharing common wordlines 202). Unless expressly distinguished, a reference to a page of memory cells herein refers to the memory cells of a logical page of memory cells. Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

FIG. 2B is another schematic of a portion of an array of memory cells 200B as could be used in a memory of the type described with reference to FIG. 1B, e.g., as a portion of the array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B can incorporate vertical structures which can include semiconductor pillars where a portion of a pillar can act as a channel region of the memory cells of NAND strings 206. The NAND strings 206 can be each selectively connected to a bitline $204_0$-$204_M$ by a select transistor 212 (e.g., that can be drain select transistors, commonly referred to as select gate drain) and to a common source 216 by a select transistor 210 (e.g., that can be source select transistors, commonly referred to as select gate source). Multiple NAND strings 206 can be selectively connected to the same bitline 204. Subsets of NAND strings 206 can be connected to their respective bitlines 204 by biasing the select lines $215_0$-$215_K$ to selectively activate particular select transistors 212 each between a NAND string 206 and a bitline 204. The select transistors 210 can be activated by biasing the select line 214. In some embodiments, each sub-block or string of memory cells has a separate select line 214 from other sub-blocks or strings. In some embodiments, a pair of sub-blocks shares a select line 214. Each wordline 202 can be connected to multiple rows of memory cells of the memory array 200B. Rows of memory cells that are commonly connected to each other by a particular wordline 202 can collectively be referred to as tiers.

Figure 3:
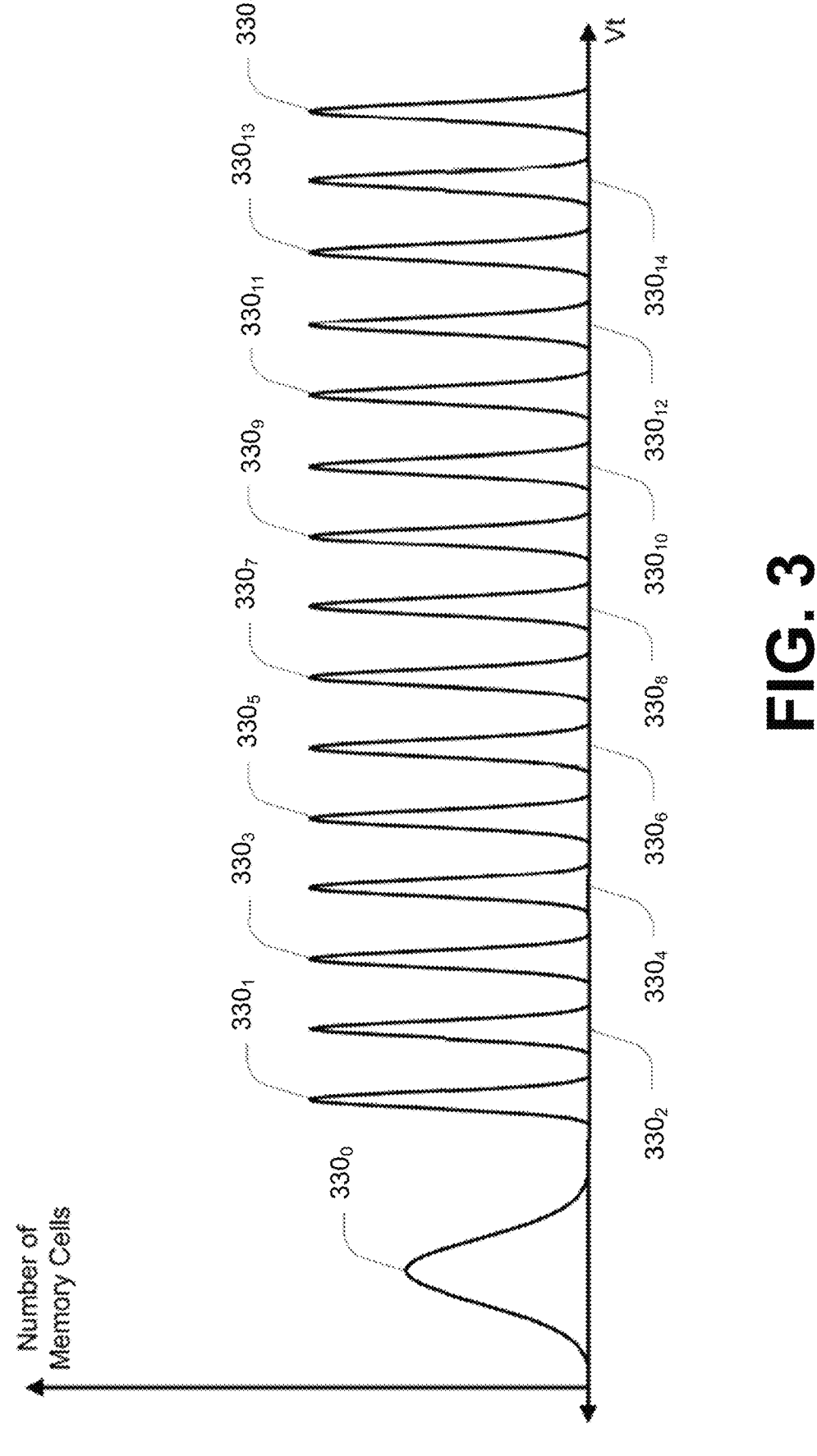
FIG. 3 is a conceptual depiction of threshold voltage distributions of multiple memory cells of a memory array according to an embodiment.

FIG. 3 is a conceptual depiction of threshold voltage ranges of multiple memory cells. FIG. 3 illustrates an example of threshold voltage ranges and their distributions for a population of a sixteen-level memory cells, e.g., QLC memory cells. For example, such a memory cell can be programmed to a threshold voltage ($V_t$) that falls within one of sixteen different threshold voltage ranges $330_0$-$330_{15}$, each being used to represent a data state corresponding to a bit pattern of four bits. The threshold voltage range $330_0$ typically has a greater width than the remaining threshold voltage ranges $330_1$-$330_{15}$ as memory cells are generally all placed in the data state corresponding to the threshold voltage range $330_0$, then subsets of those memory cells are subsequently programmed to have threshold voltages in one of the threshold voltage ranges $330_1$-$330_{15}$. As programming operations are generally more incrementally controlled than erase operations, these threshold voltage ranges $330_1$-$330_{15}$ can tend to have tighter distributions.

TABLE 1

| Data State | Logical Data Value |
|---|---|
| L0 | 1111 |
| L1 | 0111 |
| L2 | 1010 |
| L3 | 1000 |
| L4 | 1001 |
| L5 | 0001 |
| L6 | 0000 |
| L7 | 0010 |
| L8 | 0110 |
| L9 | 0100 |
| L10 | 1100 |
| L11 | 1101 |
| L12 | 0101 |
| L13 | 0111 |
| L14 | 0011 |
| L15 | 1011 |

The threshold voltage ranges $330_0$, $330_1$, $330_2$, $330_3$, $330_4$, $330_5$, $330_6$, $330_7$, $330_8$, $330_9$, $330_{10}$, $330_{11}$, $330_{12}$, $330_{13}$, $330_{14}$, and $330_{15}$ can each represent a respective data state (e.g., $V_t$ level), e.g., L0, L1, L2, L3, L4, L5, L6, L7, L8, L9, L10, L11, L12, L13, L14 and L15, respectively. As an example, if the threshold voltage of a memory cell is within the first of the sixteen threshold voltage ranges $330_0$, the memory cell in this case can be storing a data state L0 having a data value of logical '1111' and is typically referred to as the erased state of the memory cell. If the threshold voltage is within the second of the sixteen threshold voltage ranges $330_1$, the memory cell in this case can be storing a data state L1 having a data value of logical '0111'. If the threshold voltage is within the third of the sixteen threshold voltage ranges $330_2$, the memory cell in this case can be storing a data state L2 having a data value of logical '1010,' and so on. Table 1 provides one possible correspondence between the data states and their corresponding logical data values (or logical states). Other assignments of data states (e.g., $V_t$ levels) to logical data values (e.g., logical bit patterns) are known or can be envisioned. Memory cells remaining in the lowest data state (e.g., the erased state or L0 data state), as used herein, will be deemed to be programmed to the lowest data state.

Figure 4:
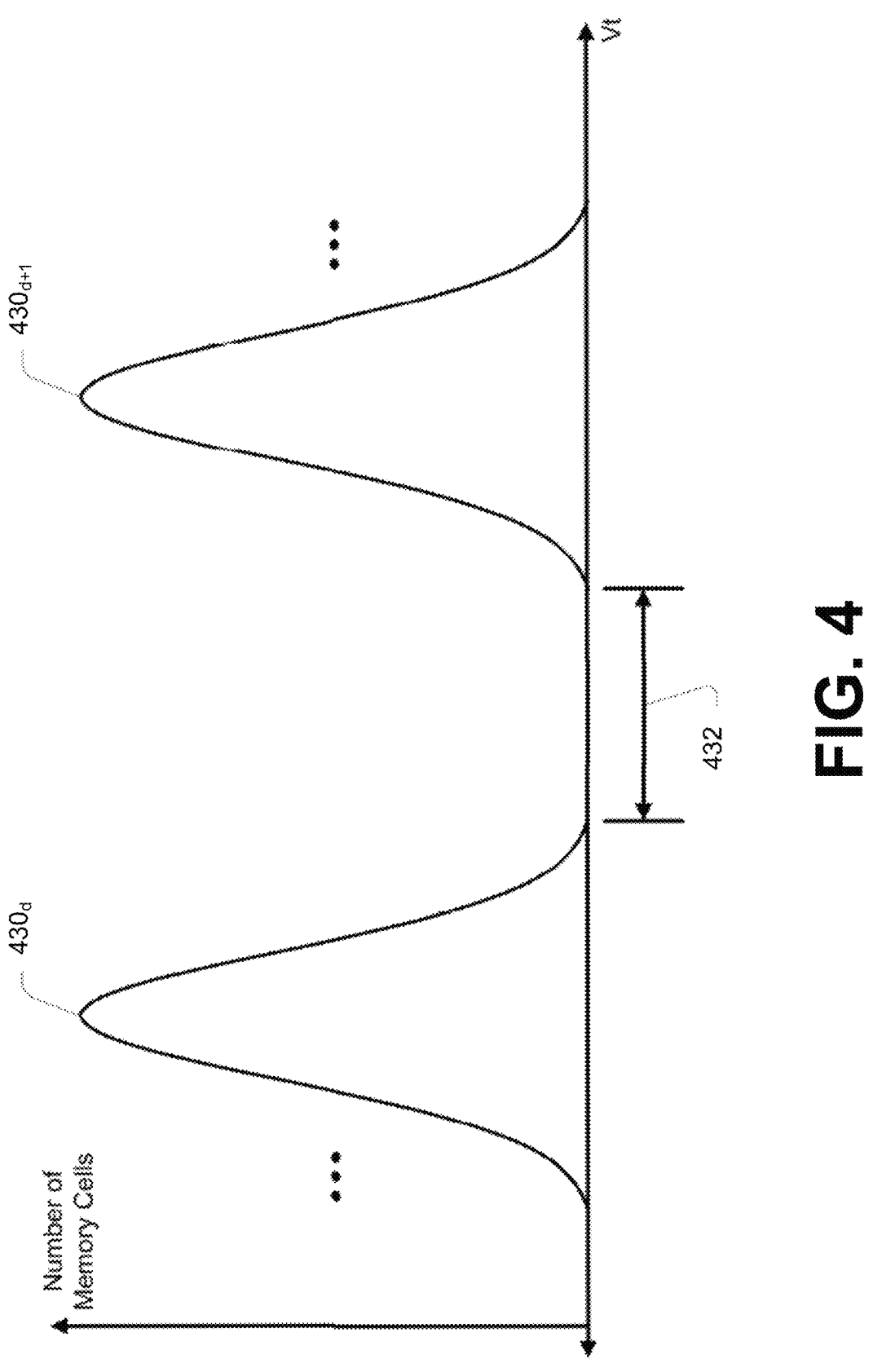
FIG. 4 is a conceptual depiction of a threshold voltage distribution of multiple memory cells at one stage following programming for use with various embodiments.

FIG. 4 is a conceptual depiction of a threshold voltage distribution of multiple memory cells following a programming operation. The threshold voltage distributions $430_d$-$430_{d+1}$ of FIG. 4 can represent some portion of the distributions for threshold voltage ranges $330_0$-$330_{15}$ of FIG. 3 at the completion of a programming operation for memory cells. With reference to FIG. 4, adjacent threshold voltage distributions 430 are typically separated by some read window margin 432 (e.g., dead space) at the completion of programming. Applying a sense voltage (e.g., read level voltage) within the read window margin 432 to the control gates of the multiple memory cells can be used to distinguish between the memory cells of the threshold voltage distribution $430_d$ (and any lower threshold voltage distribution) and the memory cells of the threshold voltage distribution $430_{d+1}$ (and any higher threshold voltage distribution).

Due to the phenomenon known as slow charge loss (SCL), the threshold voltage of a memory cell changes in time as the electric charge of the cell is degrading, which is referred to as "temporal voltage shift" (since the degrading electric charge causes the voltage distributions to shift along the voltage axis towards lower voltage levels). The threshold voltage is changing rapidly at first (immediately after the memory cell was programmed, referred to as quick charge loss (QLC)), and then slows down in an approximately logarithmic linear fashion with respect to the time elapsed since the cell programming event. This temporal voltage shift reduces the read window margin 432 between the threshold voltage distributions $430_d$-$430_{d+1}$ over time, and can cause these threshold voltage distributions to overlap, making it more difficult to distinguish between adjacent threshold voltage distributions.

Figures 5A, 5B:
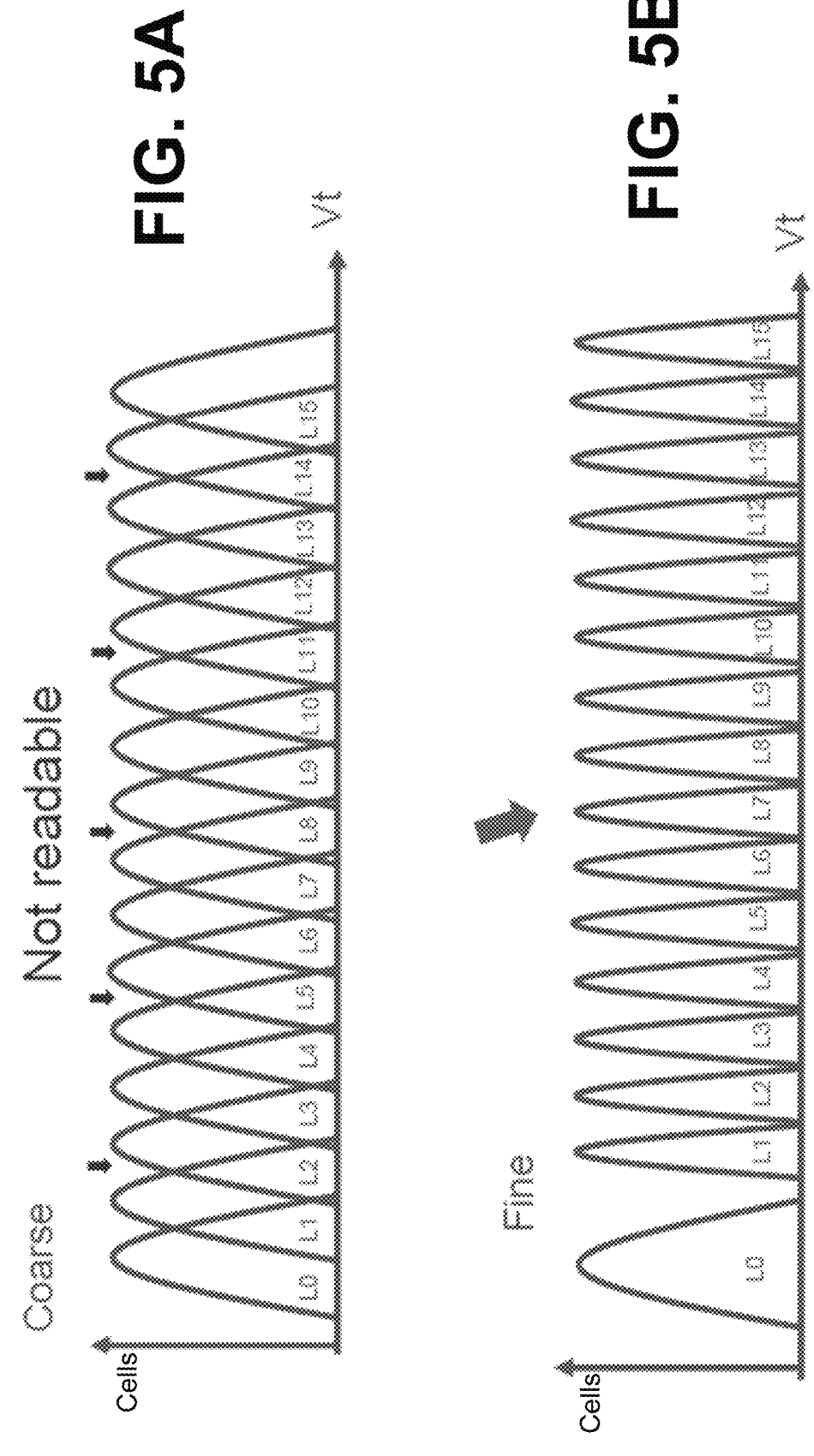
FIG. 5A is a graph illustrating an example of a set of threshold voltage distributions, after coarse programming, that are not readable according to at least one embodiment.
FIG. 5B is a graph illustrating the example of the set of threshold voltage distributions (FIG. 5B), after fine programming, that are readable according to at least one embodiment.

FIG. 5A is a graph illustrating an example of a set of threshold voltage distributions, after coarse programming, that are not readable according to at least one embodiment. Coarse programming can be compared to initial pass programming in which the Vt distributions are highly overlapped when coarse programming many Vt distributions, e.g., as is the case in programming QLC or PLC memory. Due to this overlapping of the Vt distributions, the coarse-programmed sets of threshold Vt distributions may also be referred to herein as intermediate Vt distributions. This overlapping occurs due to less precise programming in which each Vt distribution widely covers a range of threshold voltage that coarsely approximates a more accurate (finer) threshold voltage range that is intended for each respective Vt distribution.

FIG. 5B is a graph illustrating the example of the set of threshold voltage distributions (FIG. 5B), after fine programming, that are readable according to at least one embodiment. When fine programming is completed, e.g., to a final set of Vt distributions, each Vt distribution is more finely defined over a focused threshold voltage range intended for each respective logical state. When this occurs, the read window margins between respective Vt distributions are widened such that individual logical states across different memory cells of a set of memory cells can be distinguished when read.

Figure 6:
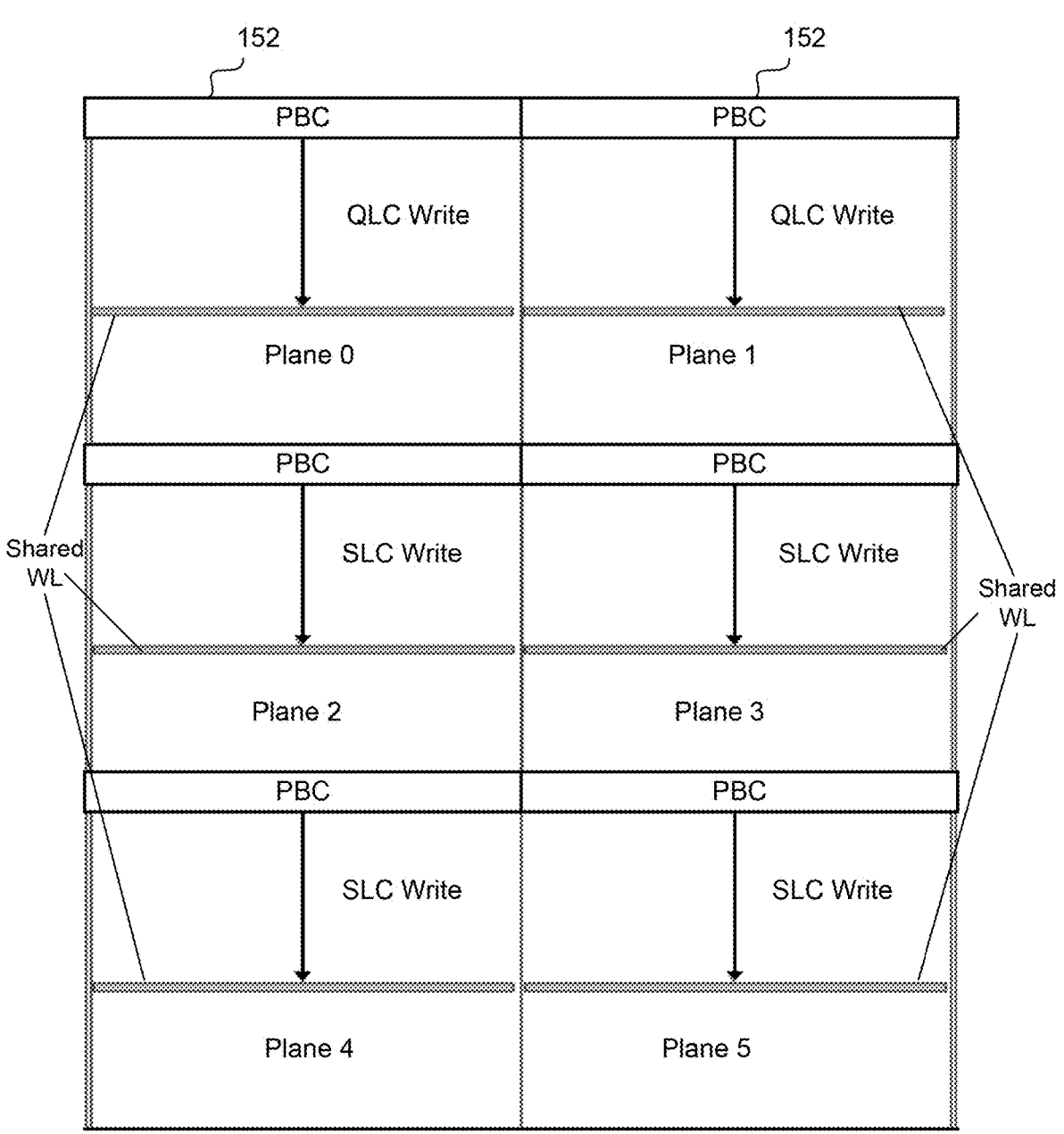
FIG. 6 is a structural flow diagram illustrating concurrent writes performed in quad-level cell (QLC) memory and single-level cell (SLC) memory according to an embodiment.

FIG. 6 is a structural flow diagram illustrating concurrent writes performed in quad-level cell (QLC) memory and single-level cell (SLC) memory according to an embodiment. In some embodiments, the concurrent program manager 137 causes the page buffer 152 (and programming hardware) to concurrently program data to a first set of memory cells of QLC memory within Plane 0 and to a second set of memory cells of SLC memory in either Plane 2 or Plane 4. As illustrated, each of Plane 0, Plane 2, and Plane 4 have a shared wordline (WL) with which the first and second sets of memory cells are associated, e.g., coupled.

In some embodiments, the concurrent program manager 137 causes the page buffer 152 to concurrently program data to a third set of memory cells of QLC memory within Plane 1 and to a fourth set of memory cells of SLC memory in either Plane 3 or Plane 5. As illustrated, each of Plane 1, Plane 3, and Plane 5 have a shared wordline (WL) with which the first and second sets of memory cells are associated, e.g., coupled. When the concurrent programming takes place, the concurrent program manager 137 can use QLC mode of programming for programming to the QLC memory and to the SLC memory, thus not requiring any additional programming hardware (e.g., charge pumps, line drivers, and the like) or additional control logic.

Figure 7:
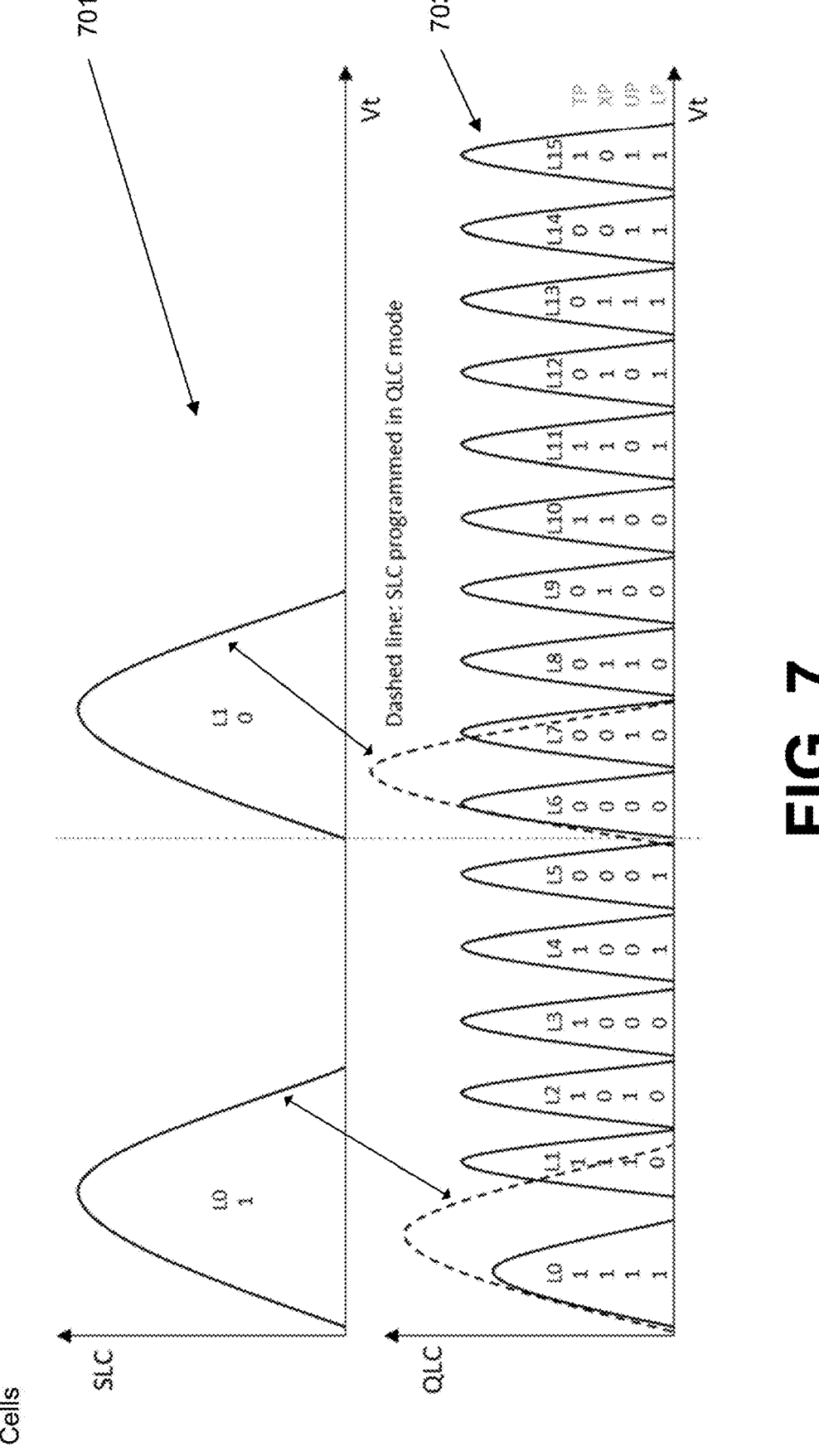
FIG. 7 is a set of graphs illustrating logical states in the SLC memory that correspond in threshold voltage range to logical states in the QLC memory according to an embodiment.

FIG. 7 is a set of graphs illustrating logical states in the SLC memory that correspond in threshold voltage range to logical states in the QLC memory according to an embodiment. Specifically, a first graph 701 illustrates two logical states for a page of SLC data associated with bit values, namely a first logical state having a "1" bit value corresponding to the L0 $V_t$ level and a second logical state having a "0" bit value corresponding to the L1 $V_t$ level. Further, a second graph 703 illustrates the sixteen logical states for a page of QLC data, each logical state associated with a string of logical bit values, as previously discussed with reference to FIG. 3 and Table 1. Overlaid on top of the second graph 703 in dashed lines are the two logical states of the SLC data that correspond (e.g., approximate) in threshold voltage (Vt) range to two logical states of the QLC page of data. More specifically, the first SLC logical state ("1" or SLC L0) corresponds in Vt range to the first QLC logic state ("1111" or QLC L0) and the second SLC logical state ("0" or SLC L1) corresponds in Vt range to the seventh QLC logical state ("0000" or QLC L6). These logical state/Vt level correspondences are summarized in Table 2.

TABLE 2

| SLC Bit Value | SLC Vt Level | QLC Bit Pattern | QLC Vt Level |
|---|---|---|---|
| 1 | L0 | 1111 | L0 |
| 0 | L1 | 0000 | L6 |

In at least some embodiments, the concurrent program manager 137 accesses a conversion data structure such as that contains the contents of Table 2 and that is stored in local memory or in the array of memory cells 104. The contents of such a conversion data structure may include a grey coding that enables mapping between logical states across multiple memory types, as is further expanded upon with reference to FIG. 8, FIGS. 9A-9B, and Tables 3-4. Thus, the discussed mapping operations using the conversion data structure may be applied between any less-densely-populated memory (SLC, MLC, TLC) and any more-densely-populated memory (TLC, QLC, PLC). Such a conversion data structure may store multiple tables of mapping values.

In these embodiments, the concurrent program manager 137 maps, using the conversion data structure, a first logical state (e.g., "1111" or QLC L0) to a second logical state (e.g., "1" or SLC L0) and selects the threshold voltage distribution ($V_t$ range of QLC L0) corresponding to the first logical state based on the mapping. In these embodiments, the concurrent program manager 137 causes both the first set of memory cells and the second set of memory cells to be concurrently programmed with the threshold voltage distribution corresponding to the first logical state.

In at least some embodiments, this mapping is instead performed by correlating program verify voltage levels as closely corresponding to each other. For example, the concurrent program manager 137 can map, using a conversion data structure that includes program verify voltages, a first program verify voltage of the first logical state to a second program verify voltage of the second logical state. The concurrent program manager 137 may further select the threshold voltage distribution based on the mapping of program verify voltages.

As illustrated in FIG. 7, after the threshold voltage distribution of the QLC state is programmed to the SLC memory cells, the threshold voltage distribution would enjoy a similar (if not better) reliability margin (referred to herein also as RWB with reference to FIG. 4.) Specifically, the threshold voltage distribution in the SLC memory cells programmed in QLC mode will be narrower, providing a wider RWB. In some embodiments, an even better reliability margin can be obtained if a higher program verify voltage level is chosen at the same read/program verify pass voltage considering the much smaller step size in QLC programming. This higher program verify voltage could be obtained, for example, by choosing QLC L7 or L8 instead of QLC L6 to map to SLC L1.

In at least some other embodiments, the concurrent program manager 137 determines, based on information within the second command, that the second logical state (e.g., "1" or SLC L0) corresponds to the first logical state (e.g., "1111" or QLC L0). In embodiments, in response to this determination from the information within the second command, the concurrent program manager 137 causes the first set of memory cells and the second set of memory cells to be concurrently programmed with the threshold voltage distribution.

Figure 8:
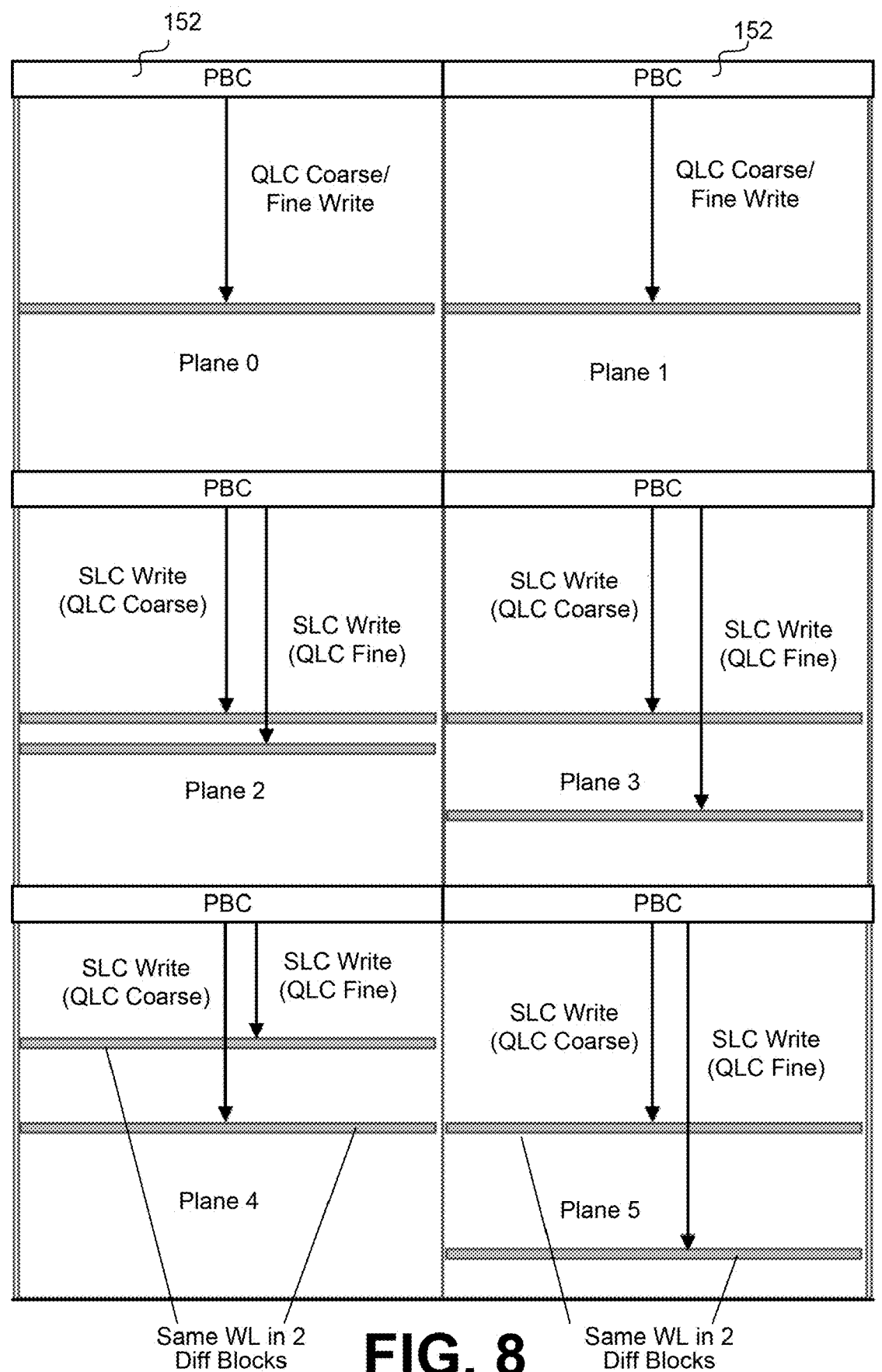
FIG. 8 is a structural flow diagram illustrating concurrent coarse and fine writes performed in QLC memory along with SLC writes for each of the coarse and fine writes according to various embodiments.

FIG. 8 is a structural flow diagram illustrating concurrent coarse and fine writes performed in QLC memory along with SLC writes for each of the coarse and fine writes according to various embodiments. As an extension to the description related to FIGS. 6-7, FIG. 8 illustrates additional concurrent programming to SLC memory, both during a coarse write to QLC (or PLC) memory and during a fine write to QLC (or PLC) memory, so that each full QLC (or PLC) programming corresponds to two times the number of SLC programming in different blocks.

More specifically, in some embodiments, the concurrent program manager 137 causes the page buffer 152 (and programming hardware) to concurrently coarse program data, as directed, to a first set of memory cells of QLC memory within Plane 0 while also programming data to a second set of memory cells of SLC memory in either Plane 2 or Plane 4. As illustrated in FIG. 6, each of Plane 0, Plane 2, and Plane 4 have a shared wordline (WL) with which the first and second sets of memory cells are associated. Additionally, the concurrent program manager 137 next causes the page buffer 152 to concurrently fine program the data, as directed, to the first set of memory cells of QLC memory within Plane 0 while also programming data to a third set of memory cells of SLC memory in either Plane 2 or Plane 4. As illustrated, by way of example, the memory cells at which the SLC programming occurs between the coarse and fine programming operations of the QLC memory are associated with the same (or shared) WL in different blocks within the same plane (e.g., whether within Plane 2 or Plane 4). The same concurrent program operations may be carried out on Planes 1, 3, 5 as just described with reference to Planes 0, 2, and 4, although the memory cells programmed may be distributed differently across another shared WL, and will thus not be described in detail.

Thus, in various embodiments, causing the first set of memory cells (associated with the first array) to be concurrently programmed may be a coarse programming of QLC memory and the concurrent programming includes programming data to the second set of memory cells of the second array (e.g., of SLC or other less-densely-programmed memory). The concurrent program manager 137 may further receive a third command to program a third set of memory cells of the second array with the second logical state. According to the above example, as illustrated in FIG. 8, the third set of memory cells may be in either Plane 2 or Plane 4 for purposes of explanation, but be at a different physical block than the second set of memory cells within the same plane or a different plane. In these embodiments, the concurrent program manager 137 then causes a fine programming of the first set of memory cells while concurrently causing the third set of memory cells to be programmed with the threshold voltage distribution (e.g., the Vt distribution also used to program the first set of memory cells).

FIG. 9A is a set of graphs illustrating logical states in multi-level cell (MLC) memory that correspond in threshold voltage range to logical states in the QLC memory according to various embodiments and as an extension to the mapping illustrated in FIG. 7. Specifically, a first graph 901 illustrates four logical states for a page of MLC data, each logical state associated with a string of logical bit values, namely logical states L0 through LA. Further, a second graph 903 illustrates the sixteen logical states for a page of QLC data, each logical state associated with a different string of logical bit values, as previously discussed with reference to FIG. 3 and Table 1. The mapping between these logical states (whether performed between Vt level, also referred to as data states herein, or between strings of logical bit values) is illustrated in Table 3.

TABLE 3

| MLC Bit Pattern | MLC Vt Level | QLC Bit Pattern | QLC Vt Level |
|---|---|---|---|
| 11 | L0 | 111 | L0 |
| 01 | L1 | 1001 | L4 |
| 10 | L2 | 0110 | L8 |
| 00 | L3 | 0101 | L12 |

Overlaid on top of the second graph 903 in dashed lines are approximate threshold voltage (Vt) range locations where these corresponding logical states overlap in threshold voltage. For example, FIG. 9A and Table 3 illustrate how the MLC L0 threshold voltage range corresponds to that of QLC L0, the MLC L1 threshold voltage range corresponds to that of QLC LA, the MLC L2 threshold voltage range corresponds to that of QLC L8, and the MLC L3 threshold voltage range corresponds to that of QLC L12. As discussed, corresponding program (or read) verify voltages between these logical states may also be used to map the logical states between MLC memory and QLC (or PLC) memory.

FIG. 9B is a set of graphs illustrating logical states in tri-level cell (TLC) memory that correspond in threshold voltage range to logical states in the QLC memory according to various embodiments and as an extension to the mapping illustrated in FIG. 7. Specifically, a first graph 911 illustrates eight logical states for a page of TLC data, each logical state associated with a string of logical bit values, namely logical states L0 through L7. Further, a second graph 913 illustrates the sixteen logical states for a page of QLC data, each logical state associated with a different string of logical bit values, as previously discussed with reference to FIG. 3 and Table 1. The mapping between these logical states (whether performed between Vt level, also referred to as data states herein, or between strings of logical bit values) is illustrated in Table 4.

TABLE 4

| TLC Bit Pattern | TLC Vt Level | QLC Bit Pattern | QLC Vt Level |
|---|---|---|---|
| 111 | L0 | 1111 | L0 |
| 110 | L1 | 1010 | L2 |
| 100 | L2 | 1001 | L4 |
| 000 | L3 | 0000 | L6 |
| 010 | L4 | 0110 | L8 |
| 011 | L5 | 1100 | L10 |
| 001 | L6 | 0101 | L12 |
| 101 | L7 | 0011 | L14 |

Overlaid on top of the second graph 913 in dashed lines are approximate threshold voltage (Vt) range locations where these corresponding logical states overlap. For example, FIG. 9B and Table 4 illustrate how the TLC L0 threshold voltage range corresponds to that of QLC L0, the TLC L1 threshold voltage range corresponds to that of QLC L2, the TLC L2 threshold voltage range corresponds to that of QLC L4, the TLC L3 threshold voltage range corresponds to that of QLC L6, the TLC L4 threshold voltage range corresponds to that of QLC L8, the TLC L5 threshold voltage range corresponds to that of QLC L10, the TLC L6 threshold voltage range corresponds to that of QLC L12, and the TLC L7 threshold voltage range corresponds to that of QLC L14. As discussed, corresponding program/read verify voltages between these logical states may also be used to map the logical states between TLC memory and QLC (or PLC) memory.

FIG. 10 is a flow diagram of an example method 1000 of concurrently writing less-densely-programmed and more-densely-programmed memory at memory cells associated with a shared wordline according to various embodiments. The method 1000 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1000 is performed by the local media controller 135 (e.g., control logic) of FIGS. 1A-1B, e.g., by the concurrent program manager 137, on a memory array that includes a plurality of memory cells electrically coupled to a plurality of wordlines and a plurality of bitlines. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 1010, a first write command is received. More specifically, the processing logic receives a first command to program a first set of memory cells of a first array of memory cells with a first logical state. In at least one embodiment, the first array is configured with a first density, e.g., configured as one of quad-level cell (QLC) memory or penta-level cell (PLC) memory, and includes one or more first planes.

At operation 1020, a second write command is received. More specifically, the processing logic receives a second command to program a second set of memory cells of a second array of memory cells with a second logical state corresponding in threshold voltage range to the first logical state. In at least one embodiment, the second array is configured as second memory with a second density that is less than the first density, e.g., that is less-densely programmed than the first array. In embodiments, the second array is configured as one of single-level cell (SLC) memory, multi-level cell (MLC) memory, or triple-level cell (TLC) memory. In embodiments, the second array includes one or more second planes, and the first set of memory cells and the second set of memory cells are associated with a shared wordline, e.g., that crosses a plane of each of the first array and the second array.

At operation 1030, the sets of memory cells are programmed. More specifically, the processing logic causes the first set of memory cells and the second set of memory cells to be concurrently programmed with a threshold voltage distribution corresponding to the first logical state. This threshold voltage distribution may at least overlap with the threshold voltage range. Further, a program verify voltage of each of the first logical state and the second logical state may also correspond, or be within a threshold percentage of each other.

FIG. 11 illustrates an example machine of a computer system 1100 within which a set of instructions, for causing the machine to perform any one or more of the methodologies discussed herein, can be executed. In some embodiments, the computer system 1100 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the memory sub-system controller 115 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1100 includes a processing device 1102, a main memory 1104 (e.g., read-only memory (ROM), flash memory, dynamic random access memory (DRAM) such as synchronous DRAM (SDRAM) or Rambus DRAM (RDRAM), etc.), a static memory 1110 (e.g., flash memory, static random access memory (SRAM), etc.), and a data storage system 1118, which communicate with each other via a bus 1130.

Processing device 1102 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1102 can also be one or more special-purpose processing devices such as an application specific integrated circuit (ASIC), a field programmable gate array (FPGA), a digital signal processor (DSP), network processor, or the like. The processing device 1102 is configured to execute instructions 1128 for performing the operations and steps discussed herein. The computer system 1100 can further include a network interface device 1112 to communicate over the network 1120.

The data storage system 1118 can include a machine-readable storage medium 1124 (also known as a non-transitory computer-readable storage medium) on which is stored one or more sets of instructions 1126 or software embodying any one or more of the methodologies or functions described herein, including those associated with the concurrent program manager 137. The data storage system 1118 can further include the local media controller 135 and the page buffer 152 that were previously discussed. The instructions 1128 can also reside, completely or at least partially, within the main memory 1104 and/or within the processing device 1102 during execution thereof by the computer system 1100, the main memory 1104 and the processing device 1102 also constituting machine-readable storage media. The machine-readable storage medium 1124, data storage system 1118, and/or main memory 1104 can correspond to the memory sub-system 110 of FIG. 1A.

In one embodiment, the instructions 1126 include instructions to implement functionality corresponding to a controller (e.g., the memory sub-system controller 115 of FIG. 1A). While the machine-readable storage medium 1124 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
   a first array of memory cells configured with a first density and comprising one or more first planes;
   a second array of memory cells configured with a second density that is less than the first density, the second array comprising one or more second planes; and
   control logic operatively coupled with the first array and the second array, wherein the control logic is to perform operations comprising:
      receiving a first command to program a first set of memory cells of the first array with a first logical state;
      receiving a second command to program a second set of memory cells of the second array with a second logical state, wherein the first set of memory cells and the second set of memory cells are associated with a shared wordline;
      determining that the second logical state corresponds in threshold voltage range to the first logical state; and

causing, based on the determining, the first set of memory cells and the second set of memory cells to be concurrently programmed with a threshold voltage distribution corresponding to the first logical state.

2. The memory device of claim 1, further comprising a single set of charge pumps coupled with the first array, the second array, and the control logic, the single set of charge pumps configured to program memory cells of both the one or more first planes and the one or more second planes.

3. The memory device of claim 1, wherein the first array is configured as one of quad-level cell (QLC) memory or penta-level cell (PLC) memory and the second array is configured as one of single-level cell (SLC) memory, multi-level cell (MLC) memory, or triple-level cell (TLC) memory.

4. The memory device of claim 1, wherein the causing the first set of memory cells and the second set of memory cells to be concurrently programmed with the threshold voltage distribution includes causing programming of the first set and the second set of memory cells to be performed in a programming mode specific to the first density.

5. The memory device of claim 1, wherein the operations further comprise:

mapping, using a conversion data structure, the first logical state to the second logical state; and selecting the threshold voltage distribution based on the mapping.

6. The memory device of claim 1, wherein the determining comprises determining, based on information within the second command, that the second logical state corresponds to the first logical state within the threshold voltage range.

7. The memory device of claim 1, wherein causing the first set of memory cells to be concurrently programmed is a coarse programming, and wherein the operations further comprise:

receiving a third command to program a third set of memory cells of the second array with the second logical state; and causing a fine programming of the first set of memory cells while concurrently causing the third set of memory cells to be programmed with the threshold voltage distribution, wherein the third set of memory cells is also associated with the shared wordline and is in a different physical block than the second set of memory cells.

8. The memory device of claim 1, wherein the operations further comprise, in response to a read command directed at the second set of memory cells, causing a read operation to be performed at the second set of memory cells using a read level verify voltage associated with the second logical state.

9. A method comprising:

receiving, by a memory device, a first command to program a first set of memory cells of a first array of memory cells with a first logical state, wherein the first array is configured with a first density and comprises one or more first planes;

receiving, by the memory device, a second command to program a second set of memory cells of a second array of memory cells with a second logical state, wherein the second array is configured with a second density that is less than the first density and comprises one or more second planes, and wherein the first set of memory cells and the second set of memory cells are associated with a shared wordline;

determining that the second logical state corresponds in threshold voltage range to the first logical state; and causing, by control logic of the memory device, based on the determining, the first set of memory cells and the second set of memory cells to be concurrently programmed with a threshold voltage distribution corresponding to the first logical state.

10. The method of claim 9, wherein causing the first set of memory cells and the second set of memory cells to be concurrently programmed includes causing a single set of charge pumps, which are coupled with the first array and the second array, to concurrently program the first set of memory cells and the second set of memory cells with the threshold voltage distribution.

11. The method of claim 9, wherein the first array is configured as one of quad-level cell (QLC) memory or penta-level cell (PLC) memory and the second array is configured as one of single-level cell (SLC) memory, multi-level cell (MLC) memory, or triple-level cell (TLC) memory.

12. The method of claim 9, wherein the causing the first set of memory cells and the second set of memory cells to be concurrently programmed with the threshold voltage distribution includes causing programming of the first set and the second set of memory cells to be performed in a programming mode specific to the first density.

13. The method of claim 9, further comprising:

mapping, using a conversion data structure, a first program verify voltage of the first logical state to a second program verify voltage of the second logical state; and selecting the threshold voltage distribution based on the mapping.

14. The method of claim 9, wherein the determining comprises determining, based on information within the second command, that the second logical state corresponds to the first logical state within the threshold voltage range.

15. The method of claim 9, wherein causing the first set of memory cells to be concurrently programmed is a coarse programming, and further comprising:

receiving a third command to program a third set of memory cells of the second array with the second logical state; and causing a fine programming of the first set of memory cells while concurrently causing the third set of memory cells to be programmed with the threshold voltage distribution, wherein the third set of memory cells is also associated with the shared wordline and is in a different physical block than the second set of memory cells.

16. The method of claim 9, further comprising, in response to a read command directed at the second set of memory cells, causing a read operation to be performed at the second set of memory cells using a read level verify voltage associated with the second logical state.

17. A memory device comprising:

a first array of memory cells configured as one of quad-level cell (QLC) memory or penta-level cell (PLC) memory and comprising one or more first planes;

a second array of memory cells configured as second memory that is less-densely programmed than the first array, the second array comprising one or more second planes;

a single set of charge pumps coupled with the first array and the second array; and control logic operatively coupled with the first array, the second array, and the single set of charge pumps, wherein the control logic is to perform operations comprising:

receiving a first command to program a first set of memory cells of the first array with a first logical state;

receiving a second command to program a second set of memory cells of the second array with a second logical state, wherein the first set of memory cells and the second set of memory cells are associated with a shared wordline;

determining that the second logical state corresponds in threshold voltage range to the first logical state; and causing, based on the determining, the single set of charge pumps to concurrently program the first set of memory cells and the second set of memory cells with a threshold voltage distribution corresponding to the first logical state.

18. The memory device of claim 17, wherein the causing the first set of memory cells and the second set of memory cells to be concurrently programmed with the threshold voltage distribution includes causing the single set of charge pumps to program the first set and the second set of memory cells using one of a QLC mode or a PLC mode, respectively.

19. The memory device of claim 17, wherein the operations further comprise:

mapping, using a conversion data structure, the first logical state to the second logical state; and selecting the threshold voltage distribution based on the mapping.

20. The memory device of claim 17, wherein the determining comprises determining, based on information within the second command, that the second logical state corresponds to the first logical state within the threshold voltage range.

\* \* \* \* \*